United States Patent
Lee et al.

(10) Patent No.: US 11,349,442 B2
(45) Date of Patent: May 31, 2022

(54) LOW-NOISE DIFFERENTIAL TO SINGLE-ENDED CONVERTER

(71) Applicant: MEDIATEK INC., Hsinchu (TW)

(72) Inventors: Fong-Wen Lee, Hsin-Chu (TW); Yu-Hsin Lin, Hsin-Chu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/813,630

(22) Filed: Mar. 9, 2020

(65) Prior Publication Data
US 2020/0304083 A1    Sep. 24, 2020

Related U.S. Application Data

(60) Provisional application No. 62/821,511, filed on Mar. 21, 2019.

(51) Int. Cl.
H03F 3/45    (2006.01)

(52) U.S. Cl.
CPC ..... *H03F 3/45076* (2013.01); *H03F 3/45973* (2013.01); *H03F 3/45071* (2013.01)

(58) Field of Classification Search
CPC ............. H03F 3/45076; H03F 3/45973; H03F 1/3211; H03F 1/34; H03F 2203/45521; H03F 2203/45528; H03F 2203/45581; H03F 1/26; H03F 3/45475
USPC .......... 330/85, 116, 117, 160, 165, 291, 301
See application file for complete search history.

(56) References Cited

U.S. PATENT DOCUMENTS

| | | | |
|---|---|---|---|
| 5,432,476 A | 7/1995 | Tran | |
| 5,856,758 A | 1/1999 | Joffe | |
| 6,559,720 B1 * | 5/2003 | Huijsing | H03F 3/45197 330/253 |
| 7,253,680 B2 * | 8/2007 | Laletin | G01R 31/3004 330/69 |
| 7,391,257 B1 | 6/2008 | Denison | |
| 9,595,931 B2 * | 3/2017 | Mallinson | H03F 3/45076 |
| 2016/0079943 A1 | 3/2016 | Mallinson | |
| 2017/0019078 A1 | 1/2017 | Galal | |

OTHER PUBLICATIONS

Hooman Hashemi, Differential-to-single-ended converter, EDN Design Ideas, Mar. 14, 1996, p. 96, XP000592123.
Office Action dated Nov. 30, 2021 in European Application No. 20 162 713.0.

* cited by examiner

*Primary Examiner* — Khanh V Nguyen
(74) *Attorney, Agent, or Firm* — Oblon, McClelland, Maier & Neustadt, L.L.P.

(57) ABSTRACT

The present invention provides a differential to single-ended converter including a first input node, a second input node, an operational amplifier and a feedback circuit. The operational amplifier has a first terminal and a second terminal, wherein the first terminal of the operational amplifier receives a first signal from the first input terminal, and the second terminal of the operational amplifier receives a second signal from the second input terminal. The feedback circuit is configured to receive an output signal of the operational amplifier and generate a first feedback signal to the first terminal of the operational amplifier to reduce a swing of the first signal, and generate a second feedback signal to the second terminal of the operational amplifier to balance noises induced by the feedback circuit and inputted to the first terminal and the second terminal.

10 Claims, 2 Drawing Sheets

LOW-NOISE DIFFERENTIAL TO SINGLE-ENDED CONVERTER

CROSS REFERENCE TO RELATED APPLICATIONS

This application claims the priority of U.S. Provisional Application No. 62/821,511, filed on Mar. 21, 2019, which is included herein by reference in its entirety.

BACKGROUND

A differential to single-ended converter is generally used in an application whose input signals are differential but output loadings need to be driven by a single-ended signal. In a conventional art, the differential to single-ended converter may be implemented by a differential operational amplifier, and one of the two output signals of the differential operational amplifier is selected as the single-ended output signal. However, this differential operational amplifier may suffer common-mode feedback circuit (CMFB) noises. In addition, the differential to single-ended converter may be implemented by a single-ended operational amplifier, however, a voltage swing at one input terminal of the single-ended operational amplifier may be large, and the larger voltage swing at the input terminal of the operational amplifier may degrade a linearity of the output signal.

SUMMARY

It is therefore an objective of the present invention to provide a differential to single-ended converter, which can lower the voltage swing at the input terminals of the operational amplifier, and prevent the single-ended output signal from being influenced by the other circuits, to solve the above-mentioned problems.

According to one embodiment of the present invention, a differential to single-ended converter comprises a first input node, a second input node, an operational amplifier and a feedback circuit. The operational amplifier has a first terminal and a second terminal, wherein the first terminal of the operational amplifier receives a first signal from the first input terminal, and the second terminal of the operational amplifier receives a second signal from the second input terminal. The feedback circuit is configured to receive an output signal of the operational amplifier and generate a first feedback signal to the first terminal of the operational amplifier to reduce a swing of the first signal, and generate a second feedback signal to the second terminal of the operational amplifier to balance noises induced by the feedback circuit and inputted to the first terminal and the second terminal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
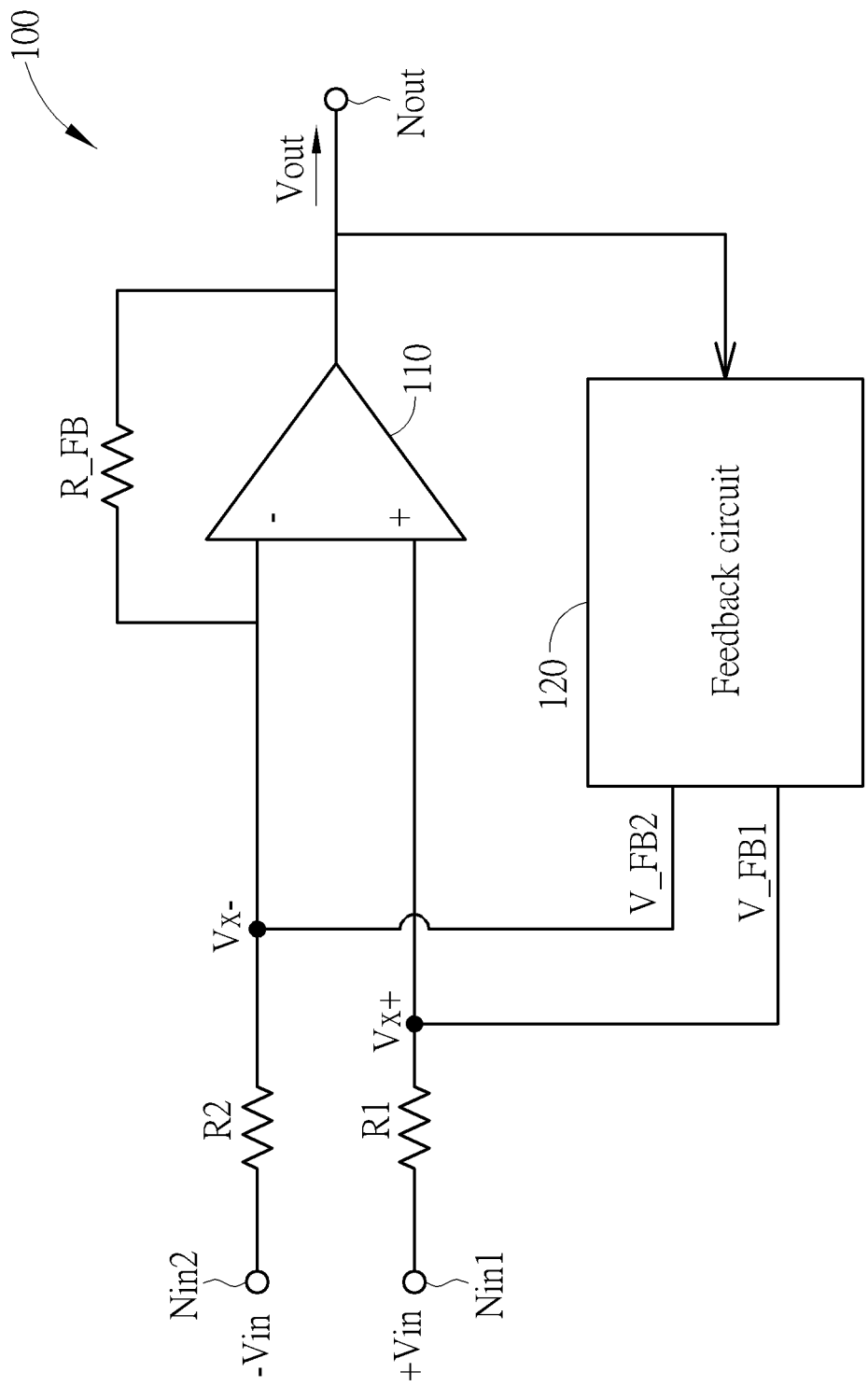
FIG. 1 is a diagram illustrating a differential to single-ended converter according to one embodiment of the present invention.

FIG. 1 is a diagram illustrating a differential to single-ended converter 100 according to one embodiment of the present invention. As shown in FIG. 1, the differential to single-ended converter 100 is configured to receive a differential signal +Vin and −Vin at a first input node Nin1 and a second input node Nin2, respectively, to generate an output signal Vout at an output node Nout. The differential to single-ended converter 100 comprises an operational amplifier 110, a feedback circuit 120, a first resistor R1, a second resistor R2 and a feedback resistor R_FB, wherein the first resistor R1 is coupled between the first input node N1 and a positive terminal of the operational amplifier 110, the second resistor R2 is coupled between the second input node N2 and a negative terminal of the operational amplifier 110, and the feedback resistor R_FB is coupled between the negative terminal and the output terminal of the operational amplifier 110.

In the operations of the differential to single-ended converter 100, the positive terminal of the operational amplifier 110 receives a first signal Vx+ from the first input node Nin1 via the first resistor R1, the negative terminal of the operational amplifier 110 receives a second signal Vx− from the second input node Nin2 via the second resistor R2. In this embodiment, because of the feedback resistor R_FB connected between the negative terminal and the output terminal of the operational amplifier 110, the negative terminal can be controlled to be almost a DC level (i.e. the swing is very small). In order to reduce the swing at the positive terminal of the operational amplifier 110 to improve the linearity, the feedback circuit 120 refers to the output signal Vout to generate a first feedback signal V_FB1 to the positive terminal of the operational amplifier 110 to reduce the swing of the first signal Vx+. Furthermore, although the linearity of the differential to single-ended converter 100 is improved by adding the first feedback signal V_FB1 to the first signal Vx+, the noise of the feedback circuit 120 may also be induced to first signal Vx+. Therefore, to prevent the output signal Vout from being influenced by the noise induced by the feedback circuit 120, the feedback circuit 120 further generates a second feedback signal V_FB2 to the negative terminal of the operational amplifier 110 to balance noises induced by the feedback circuit 120 and inputted to the positive terminal and the negative terminal of the operational amplifier 110.

In the embodiment shown in FIG. 1, the first feedback signal V_FB1 and the second feedback signal V_FB2 are in phase so that the noises induced to the first signal Vx+ and the second signal Vx− are balanced, and the first feedback signal V_FB1 and the first signal Vx+ are opposite in phase to reduce the swing at the positive terminal of the operational amplifier 110. Therefore, the second feedback signal V_FB2 and the second signal Vx− are in phase (i.e. the second feedback signal V_FB2 is not used to reduce the swing of the second signal Vx−).

In light of above, by providing the feedback resistor R_FB and using the feedback circuit 120 to generate the first feedback signal V_FB1 and the second feedback signal V_FB2 to the positive terminal and the negative terminal of the operational amplifier 110, respectively, both the positive terminal and the negative terminal of the operational amplifier 110 have the small voltage swing to improve the linearity, and the noise induced by the feedback circuit 120 will not influence the accuracy of the output signal Vout.

Figure 2:
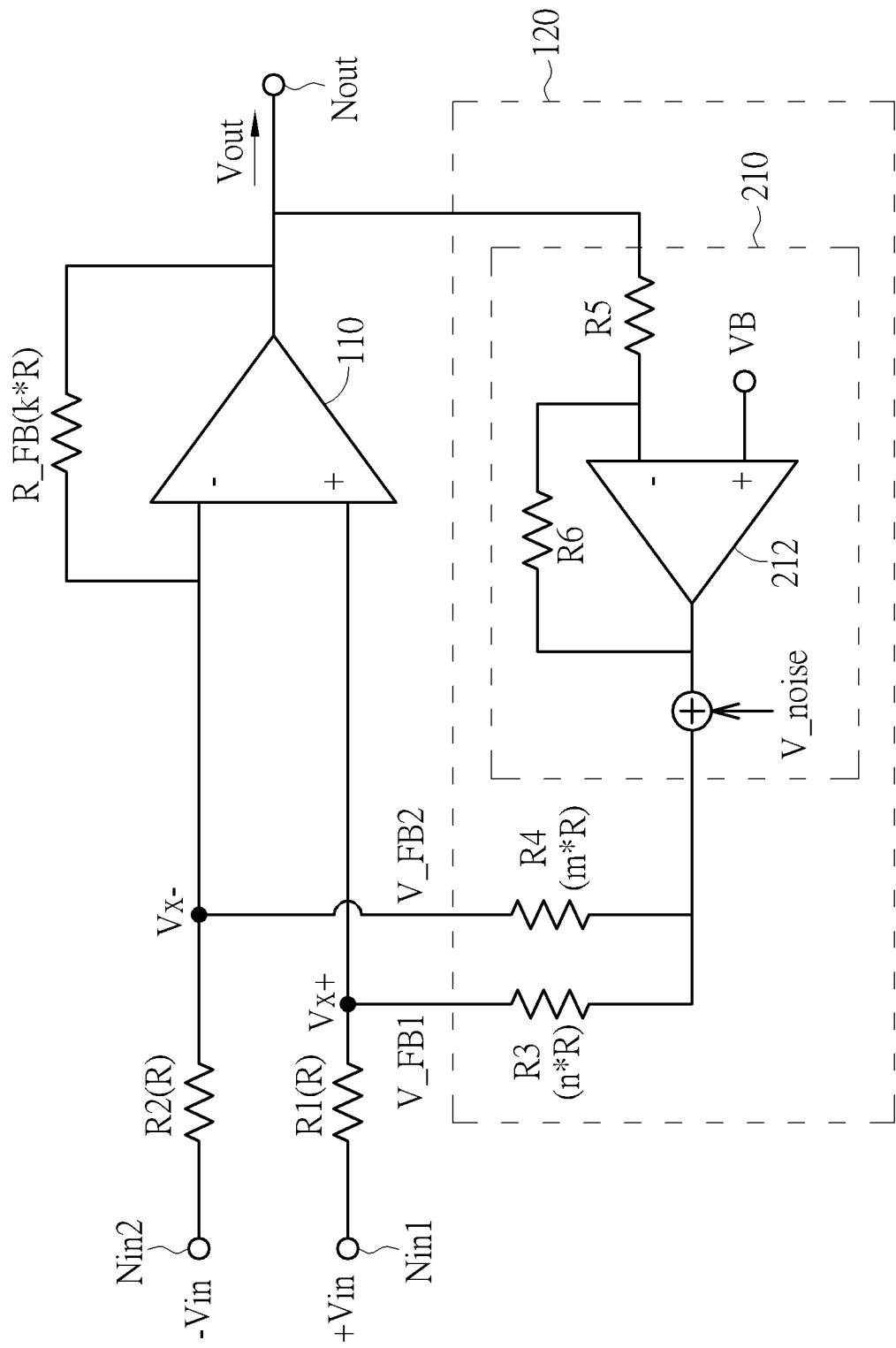
FIG. 2 is a diagram illustrating the feedback circuit according to one embodiment of the present invention.

FIG. 2 is a diagram illustrating the feedback circuit 120 according to one embodiment of the present invention. As shown in FIG. 2, the feedback circuit 120 comprises a buffer 210, a third resistor R3 and a fourth resistor R4, wherein the buffer 210 comprises an operational amplifier 212 and two resistors R5 and R6, and the positive terminal of the operational amplifier 212 receives a bias voltage VB. In this embodiment, the buffer 210 can be an inverting buffer, and the buffer 210 receives the output signal Vout to generate a buffered output signal for the generations of the first feedback signal V_FB1 and the second feedback signal V_FB2, that is the phase of the output signal Vout is different from the phase of each of the first feedback signal F_FB1 and the second feedback signal V_FB2 (e.g. the phase difference may be 180°). In addition, resistance of the first resistor R1 and the third resistor R3 are designed to make that a voltage swing at the positive terminal of the operational amplifier 110 is substantially equal to zero, and the resistance of the first resistor R1, the second resistor R2, the third resistor R3, the fourth resistor R4 and the feedback resistor R_FB are designed to make that the output signal Vout is not affected by the noises generated by the buffer 210. In detail, assuming that the resistance of the each of the first resistor R1 and the second resistor R2 is "R", the resistance of the third resistor R3 is "n*R", the resistance of the fourth resistor R4 is "m*R", the resistance of the feedback resistor R_FB is "k*R", and the resistance of the resistor R5 is equal to the resistance of the resistor R6, in order to make the positive terminal of the operational amplifier 110 be substantially equal to zero, a summation of the feedback signal V_FB1 and the signal provided by the input signal +Vin is equal to zero, that is:

$$Vout*(-R6/R5)*(1/(1+n))+Vin*(n/(1+n))=0 \quad (1);$$

and the equation (1) can be simplified as:

$$n=Vout/Vin \quad (2).$$

In order to control the noise from the buffer 210 to the output signal Vout to be zero, the equation (3) provided below should be satisfied:

$$V\_noise*(1/1+n)*(1+k*(1+m)/m)-V\_noise*(k/m)=0 \quad (3).$$

In addition, the signal transfer function of the differential to single-ended converter 100 is provided below:

$$Vout*(R6/R5)*(k/m)+Vin*k=Vout \quad (4);$$

and the equation (4) can be simplified as:

$$\frac{Vout}{Vin-(-Vin)} = \frac{k}{2\left(1-\frac{k}{m}\right)}; \quad (5)$$

wherein the term $$\frac{Vout}{Vin-(-Vin)}$$

is a gain of the differential to single-ended converter 100.

By combining the above equations (2), (3) and (5), the values n, m and k can be determined. For example, if the gain of the differential to single-ended converter 100 is equal to one, n, m and k can be determined as 2, (2/3) and (1/2), that is the resistance of the first resistor R1, the second resistor R2, the third resistor R3, the fourth resistor R4 and the feedback resistor R_FB are in the ratio 1:1:2:(2/3):(1/2). If the gain of the differential to single-ended converter 100 is equal to two, n, m and k can be determined as 4, (12/5) and (3/2), that is the resistance of the first resistor R1, the second resistor R2, the third resistor R3, the fourth resistor R4 and the feedback resistor R_FB are in the ratio 1:1:4:(12/5):(3/2). If the gain of the differential to single-ended converter 100 is equal to four, n, m and k can be determined as 8, (56/9) and (7/2), that is the resistance of the first resistor R1, the second resistor R2, the third resistor R3, the fourth resistor R4 and the feedback resistor R_FB are in the ratio 1:1:8:(56/9):(7/2).

Briefly summarized, in the differential to single-ended converter of the present invention, a feedback circuit is configured to receive the output signal and generate a first feedback signal to the positive terminal of the operational amplifier to reduce a swing of the first signal, and further generate a second feedback signal to the negative terminal of the operational amplifier to balance noises induced by the feedback circuit and inputted to the first terminal and the second terminal. Therefore, the differential to single-ended converter has better linearity without being influenced by the noise induced by the feedback circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A differential to single-ended converter, comprising:
    a first input node and a second input node configured to receive a pair of differential signals;
    an operational amplifier having a positive input terminal, a negative input terminal, and an output terminal;
    a first resistor coupled between the first input node of the differential to single-ended converter and the positive input terminal of the operational amplifier;
    a second resistor coupled between the second input node of the differential to single-ended converter and the negative input terminal of the operational amplifier;
    a feedback resistor coupled between the output terminal and the negative input terminal of the operational amplifier; and
    a feedback circuit comprising:
        a buffer including a buffer input terminal and a buffer output terminal;
        a third resistor coupled between the buffer output terminal of the buffer and, the positive input terminal of the operational amplifier; and
        a fourth resistor coupled between the buffer output terminal of the buffer and the negative input terminal of the operational amplifier, wherein, when a first resistance value of the first resistor is set to R and a second resistance value of the second resistor is set to R,
a third resistance value of the third resistor is set to n*R,
a fourth resistance value of the fourth resistor is set to m*R,
m and n are positive numbers, and
m is less than (n−1).

2. The differential to single-ended converter of claim 1, wherein the buffer is an inverting buffer.

3. The differential to single-ended converter of claim 1, wherein the first resistance value and the third resistance value are designed to make that a voltage swing at the positive input terminal of the operational amplifier is substantially equal to zero.

4. The differential to single-ended converter of claim 1, wherein the first resistance value, the second resistor resistance value, the third resistance value, the fourth resistance value, and a feedback resistance value of the feedback resistor are designed to make that an output signal at the output terminal of the operational amplifier is not affected by a noise signal generated by the buffer.

5. The differential to single-ended converter of claim 1, wherein a feedback resistance value of the feedback resistor is less than the third resistance value of the third resistor.

6. The differential to single-ended converter of claim 1, wherein when the first resistance value is set to R and the second resistance value is set to R, the third resistance value, the fourth resistance value, and a feedback resistance value of the feedback resistor satisfy equations:

$$V\text{out}*(-R6/R5)*(1/(1+n))+V\text{in}*(n/(1+n))=0,$$

$$(1/1+n)*(1+k*(1+m)/m)-(k/(m)=0, \text{ and}$$

$$V\text{out}*(R6/R5)*(k/m)+V\text{in}*k=V\text{out},$$

wherein
(R6/R5) is a resistance ratio provided by the buffer,
the third resistance value is set to n*R,
the fourth resistance value is set to m*R,
the feedback resistance value is set to k*R,
the output terminal of the operational amplifier is configurated to provide an output signal represented by "Vout", and
the first input node and the second input node are configured to receive the pair of differential signals represented by "+Vin" and "−Vin", respectively.

7. The differential to single-ended converter of claim 6, wherein when a gain of the differential to single-ended converter is equal to one, the first resistance value, the second resistance value, the third resistance value, the fourth resistance value, and the feedback resistance value are in a ratio 1:1:2:(2/3):(1/2).

8. The differential to single-ended converter of claim 6, wherein when a gain of the differential to single-ended converter is equal to two, the first resistance value, the second resistance value, the third resistance value, the fourth resistance value, and the feedback resistance value are in a ratio 1:1:4:(12/5):(3/2).

9. The differential to single-ended converter of claim 6, wherein when a gain of the differential to single-ended converter is equal to four, the first resistance value, the second resistance value, the third resistance value, the fourth resistance value, and the feedback resistance value are in a ratio 1:1:8:(56/9):(7/2).

10. The differential to single-ended converter of claim 1, wherein when the first resistance value is set to R and the second resistance value is set to R, the third resistance value and the fourth resistance value satisfy an equation:

$$m=(n-1)-(n-1)/(n+1).$$

* * * * *